(12) United States Patent
Hosotani et al.

(10) Patent No.: US 11,228,211 B2
(45) Date of Patent: Jan. 18, 2022

(54) WIRELESS POWER RECEIVING CIRCUIT MODULE

(71) Applicant: Murata Manufacturing Co., Ltd., Kyoto-fu (JP)

(72) Inventors: Tatsuya Hosotani, Nagaokakyo (JP); Koyo Kaiwa, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 17/157,311

(22) Filed: Jan. 25, 2021

(65) Prior Publication Data
US 2021/0143686 A1    May 13, 2021

Related U.S. Application Data

(63) Continuation of application No. PCT/JP2019/015725, filed on Apr. 11, 2019.

(30) Foreign Application Priority Data

Sep. 25, 2018   (JP) ............................. JP2018-178810

(51) Int. Cl.
*H02J 50/70* (2016.01)
*H02J 50/90* (2016.01)
(Continued)

(52) U.S. Cl.
CPC .............. *H02J 50/70* (2016.02); *H01F 27/02* (2013.01); *H01F 27/36* (2013.01); *H01F 38/14* (2013.01);
(Continued)

(58) Field of Classification Search
None
See application file for complete search history.

(56) References Cited

U.S. PATENT DOCUMENTS

2016/0315503 A1* 10/2016 Park ..................... H02J 50/12
2017/0236049 A1*  8/2017 Kato ............... G06K 19/07783
                                                           235/492
(Continued)

FOREIGN PATENT DOCUMENTS

JP        2012-221264 A      11/2012
JP        2017-005952 A       1/2017
(Continued)

OTHER PUBLICATIONS

International Search Report issued in PCT/JP2019/015725; dated Jun. 11, 2019.
(Continued)

*Primary Examiner* — Jared Fureman
*Assistant Examiner* — Joel Barnett
(74) *Attorney, Agent, or Firm* — Studebaker & Brackett PC

(57) ABSTRACT

A wireless power receiving circuit module includes a first base, a second base, electronic components, a power receiving coil, and a ground conductor pattern. The number of layers of the second base is different from that of the first base, and the second base does not overlap with the first base in a plan view and shares a predetermined dielectric layer with the first base. The electronic components are mounted on a first main surface of the first base. The power receiving coil is formed in the second base. The ground conductor pattern is disposed on a second main surface side in the first base and overlaps with the electronic components.

20 Claims, 3 Drawing Sheets

(51) Int. Cl.
*H02J 50/10* (2016.01)
*H01F 27/02* (2006.01)
*H01F 38/14* (2006.01)
*H02J 50/00* (2016.01)
*H01F 27/36* (2006.01)
*H01F 27/24* (2006.01)

(52) U.S. Cl.
CPC ............ *H02J 50/005* (2020.01); *H02J 50/10* (2016.02); *H02J 50/90* (2016.02); *H01F 27/24* (2013.01)

(56) References Cited

U.S. PATENT DOCUMENTS

2018/0174747 A1* 6/2018 Hirobe .................. H01Q 1/521
2018/0191052 A1* 7/2018 Ndip ...................... H01L 23/66

FOREIGN PATENT DOCUMENTS

| JP | 2018-102124 A | 6/2018 |
|---|---|---|
| WO | 2018012378 A1 | 1/2018 |

OTHER PUBLICATIONS

Written Opinion issued in PCT/JP2019/015725; dated Jun. 11, 2019.

\* cited by examiner

WIRELESS POWER RECEIVING CIRCUIT MODULE

CROSS-REFERENCE TO RELATED APPLICATIONS

This application claims benefit of priority to International Patent Application No. PCT/JP2019/015725, filed Apr. 11, 2019, and to Japanese Patent Application No. 2018-178810, filed Sep. 25, 2018, the entire contents of each are incorporated herein by reference.

BACKGROUND

Technical Field

The present disclosure relates to a wireless power receiving circuit module that has a predetermined electronic circuit and wirelessly receives power from outside.

Background Art

Japanese Unexamined Patent Application Publication No. 2012-221264 describes an IC card with biometric authentication function on which an IC chip is mounted. On this IC card with biometric authentication function, a secondary battery is mounted. The IC card with biometric authentication function uses power stored in the secondary battery for biometric authentication by the IC chip, for example.

The IC chip and the secondary battery are mounted on a surface of the IC card body. A loop antenna for power reception is built in the IC card body. The loop antenna for power reception and the IC chip are overlapped with each other in a plan view.

SUMMARY

However, in the configuration of the IC card with biometric authentication function described in Japanese Unexamined Patent Application Publication No. 2012-221264, magnetic field coupling between the loop antenna for power reception and an external loop antenna for power transmission is not strong and wireless-power-receiving efficiency is low. Further, this magnetic field coupling produces electromagnetic interference which adversely affects electronic components such as an IC.

Accordingly, the present disclosure provides a wireless power receiving circuit module that improves wireless-power-receiving efficiency and is capable of suppressing electromagnetic interference which adversely affects electronic components such as an IC.

A wireless power receiving circuit module according to the present disclosure includes a first base, a second base, an electronic component, a wireless power receiving coil, and a first plane ground conductor pattern. In the first base, a plurality of dielectric layers are stacked and a circuit conductor pattern is formed. The number of layers of the second base is different from that of the first base and the second base does not overlap with the first base in a plan view and shares a predetermined dielectric layer with the first base. The electronic component is mounted on a first main surface of the first base. The wireless power receiving coil is composed of a conductor pattern formed in the second base and is electrically connected with the circuit conductor pattern. The first plane ground conductor pattern is disposed on a second main surface side in the first base, the second main surface being opposed to the first main surface, and overlaps with at least the electronic component in the plan view. The first plane ground conductor pattern acts as an electric field shield that protects the circuit conductor pattern formed in the first base against an electric field from an outside, and the wireless power receiving coil produces magnetic coupling by interlinking a magnetic flux with a magnetic field from the outside, whereby the electric field shield for the circuit conductor pattern and the magnetic coupling are established at the same time.

Accordingly, power-receiving efficiency is improved and electromagnetic interference to electronic components is suppressed.

According to the present disclosure, power-receiving efficiency can be improved and electromagnetic interference which adversely affects electronic components such as an IC can be suppressed.

DETAILED DESCRIPTION

Figure 1A:
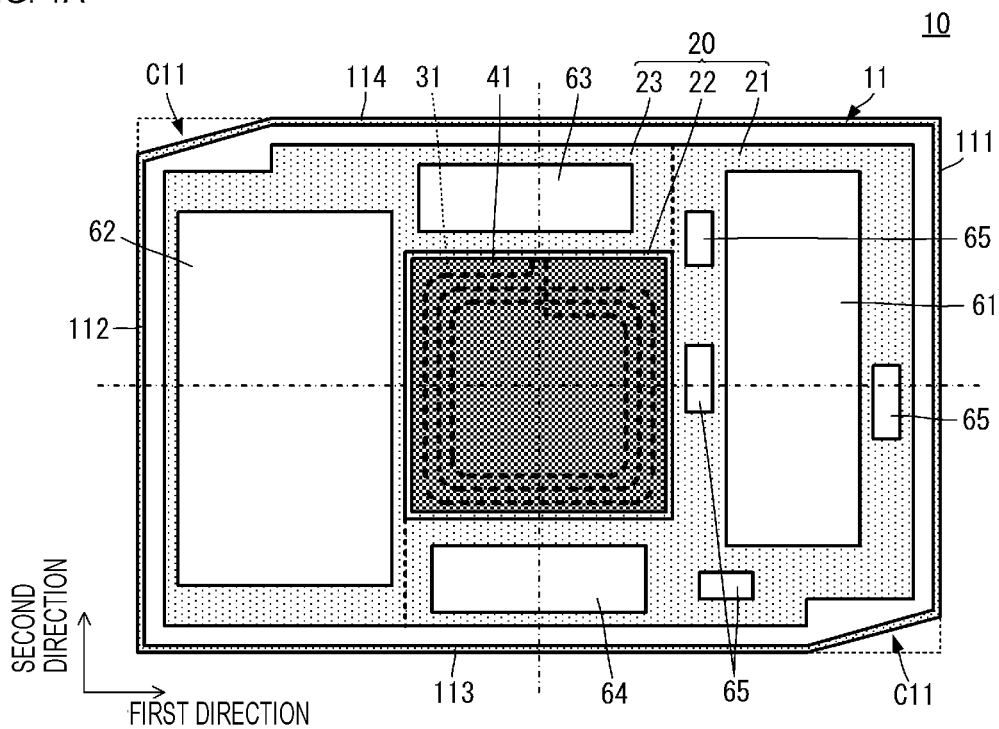
FIG. 1A is a plan view illustrating a configuration of a wireless power receiving circuit module according to an embodiment of the present disclosure.
Figure 1B:
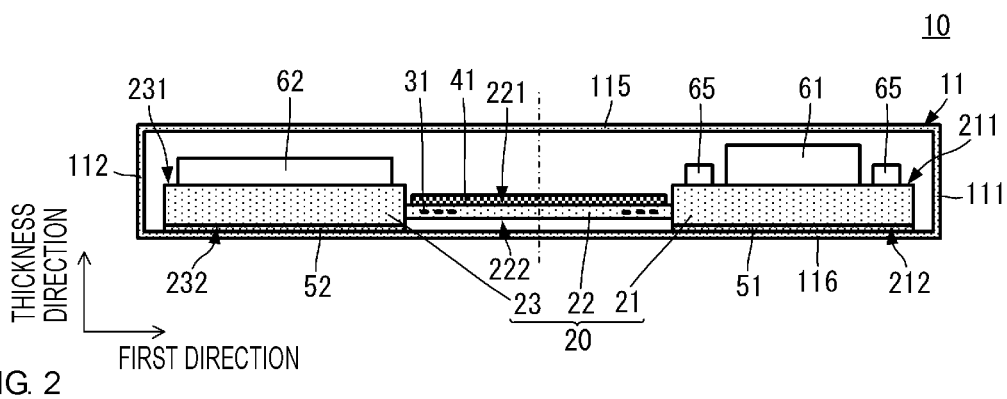
FIG. 1B is a sectional side view of the same.
Figure 2:
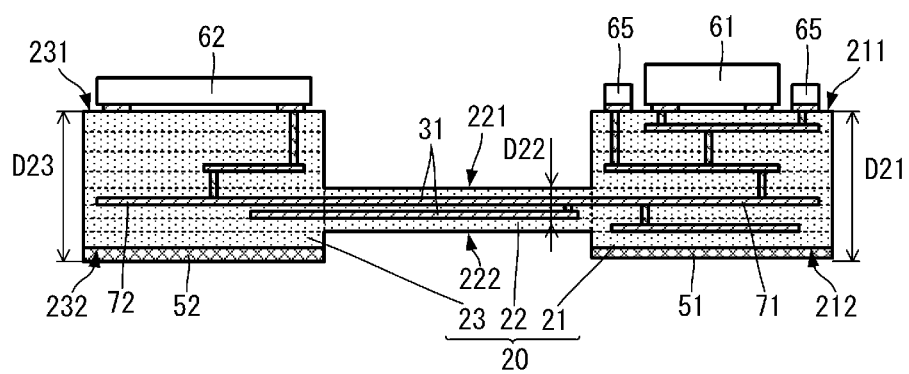
FIG. 2 is a sectional side view illustrating a configuration of a substrate.
Figure 3:
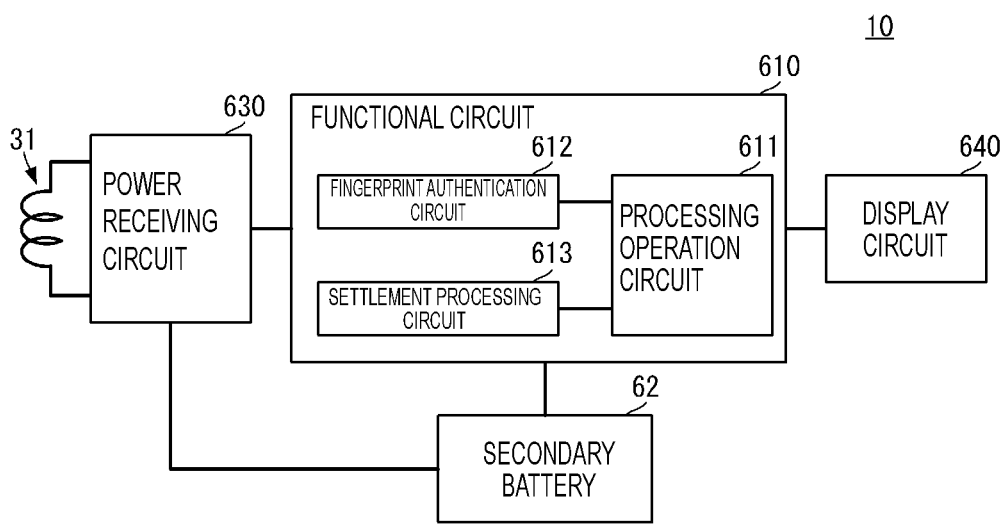
FIG. 3 is a circuit block diagram of the wireless power receiving circuit module according to the embodiment of the present disclosure.

A wireless power receiving circuit module according to an embodiment of the present disclosure will be described with reference to the accompanying drawings. FIG. 1A is a plan view illustrating a configuration of the wireless power receiving circuit module according to the embodiment of the present disclosure and FIG. 1B is a sectional side view of the same. Here, FIG. 1A is a plan view in which a top plate of a case is omitted. FIG. 2 is a sectional side view illustrating a configuration of a substrate. Here, FIG. 2 illustrates the same substrate as that of FIGS. 1A and 1B, but a shape of a conductor pattern, for example, is arbitrarily changed therein so as to clearly show characteristics. FIG. 3 is a circuit block diagram of the wireless power receiving circuit module according to the embodiment of the present disclosure.

(Circuit Configuration of Wireless Power Receiving Circuit Module)

An example of a circuit configuration of a wireless power receiving circuit module 10 will be described with reference to FIG. 3. As illustrated in FIG. 3, the wireless power receiving circuit module 10 includes a power receiving coil 31, a functional circuit 610, a secondary battery 62, a power receiving circuit 630, and a display circuit 640. The power receiving coil 31 is a power receiving coil for power reception and corresponds to a "wireless power receiving coil" of the present disclosure. The functional circuit 610 and the power receiving circuit 630 are realized by predetermined electronic components such as an IC, an active element, and a passive element. The secondary battery 62 is realized by a capacitor, for example. The display circuit 640 is realized by an LED and a liquid crystal display, for example.

The power receiving coil 31 is connected with the power receiving circuit 630. The power receiving circuit 630 is connected with the functional circuit 610 and the secondary battery 62. The functional circuit 610 is connected with the secondary battery 62 and the display circuit 640.

The power receiving coil 31 performs magnetic field coupling with a power transmitting coil 96 for power transmission in the outside (see FIG. 4A and FIG. 4B), generating current for power reception. The current for power reception outputted from the power receiving coil 31 is inputted into the power receiving circuit 630. The power receiving circuit 630 generates voltage and current which can be utilized in the functional circuit 610 or current which can be charged in the secondary battery 62 from the current for power reception, and outputs the voltage and the current to the functional circuit 610 or outputs the current to the secondary battery 62. The secondary battery 62 is charged by the power receiving circuit 630.

The functional circuit 610 receives power from the power receiving circuit 630 or power charged in the secondary battery 62 and executes a function thereof. For example, in the case of FIG. 2, the functional circuit 610 includes a processing operation circuit 611, a fingerprint authentication circuit 612, and a settlement processing circuit 613. In this case, the following functions are executed: a fingerprint authentication function by the fingerprint authentication circuit 612, a settlement function by the settlement processing circuit 613, and a function of processing by the processing operation circuit 611 executed based on a fingerprint authentication result and a settlement content. The functional circuit 610 outputs the processing result to the display circuit 640. The display circuit 640 displays the processing result.

Thus, the wireless power receiving circuit module 10 wirelessly receives power without being connected with an external power source by a cable or the like and is capable of realizing predetermined functions with the received power. Further, the wireless power reception is thus possible, so that predetermined functions can be realized even with a thin and small card, for example.

(Configuration of Wireless Power Receiving Circuit Module)

The wireless power receiving circuit module 10 having the above-described circuit configuration has a configuration as that illustrated in FIG. 1.

As illustrated in FIG. 1A and FIG. 1B, the wireless power receiving circuit module 10 includes a case 11, a substrate 20, a magnetic sheet 41, an electronic component 61, the secondary battery 62, an electronic component 63, an electronic component 64, and electronic components 65.

As illustrated in FIG. 1A, FIG. 1B, and FIG. 2, the substrate 20 includes a base 21, a base 22, and a base 23. The base 21, the base 22, and the base 23 respectively correspond to a "first base", a "second base", and a "third base" of the present disclosure.

The base 21 has a first main surface 211 and a second main surface 212 that are orthogonal to the thickness direction. The base 22 has a first main surface 221 and a second main surface 222 that are orthogonal to the thickness direction. The base 23 has a first main surface 231 and a second main surface 232 that are orthogonal to the thickness direction. The first main surface 211 of the base 21, the first main surface 221 of the base 22, and the first main surface 231 of the base 23 are the surfaces on the same side of the substrate 20. The second main surface 212 of the base 21, the second main surface 222 of the base 22, and the second main surface 232 of the base 23 are the surfaces on the same side of the substrate 20.

The base 21, the base 22, and the base 23 are disposed on different positions in a plan view of the substrate 20. In other words, the base 21, the base 22, and the base 23 do not overlap with each other in the plan view of the substrate 20. Specifically, the base 21 and the base 23 have an L shape which is bent in the middle in a plan view as illustrated in FIG. 1A. The base 21 includes portion elongated in the second direction and portion elongated in the first direction and thus has a shape in which an end of the portion elongated in the second direction and an end of the portion elongated in the first direction are connected with each other. In a similar manner, the base 23 includes portion elongated in the second direction and portion elongated in the first direction and thus has a shape in which an end of the portion elongated in the second direction and an end of the portion elongated in the first direction are connected with each other.

The base 22 is disposed in a region surrounded by the L shapes of the base 21 and the base 23. Thus, the base 22 is disposed in a central region of the substrate 20 in a plan view.

The base 21, the base 22, and the base 23 are formed in an integrated manner. Each of the base 21, the base 22, and the base 23 is composed of a multilayer body obtained by stacking a plurality of dielectric layers. The number of layers of the base 22 is smaller than the number of layers of the base 21 and the number of layers of the base 23. Accordingly, the thickness D22 of the base 22 is smaller than the thickness D21 of the base 21 and the thickness D23 of the base 23. In this configuration, the base 21 and the base 23 are rigid substrates and the base 22 is a flexible substrate, for example. Here, a rigid substrate is conceptionally a substrate made of an insulating base material having no flexibility, while a flexible substrate is a substrate having enough flexibility to be able to be bent.

The plurality of dielectric layers constituting the base 22 are common to the plurality of dielectric layers constituting the base 21 and the dielectric layers constituting the base 23 and are made of the same material as the dielectric layers of the base 21 and the base 23, being a dielectric layer structurally formed in an integrated manner (integrally-formed dielectric layer). The plurality of dielectric layers are mainly made of a liquid crystal polymer, for example. As illustrated in FIG. 3, three layers of dielectric layers constituting the base 22 are formed to be integrated with three layers of dielectric layers, positioned closer to the second main surface 212, among a plurality of dielectric layers constituting the base 21 and three layers of dielectric layers, positioned closer to the second main surface 232, among a plurality of dielectric layers constituting the base 23 respectively. In other words, the base 22 has a shape obtained by protruding part of dielectric layers among the plurality of dielectric layers constituting the base 21 from the lateral surface of the base 21 and stacking these dielectric layers.

Here, a rigid substrate and a flexible substrate can be realized by the following substrate, for example, when the rigid substrate and the flexible substrate are formed with different materials from each other.

A rigid substrate can be classified based on composition or structure. In classification based on composition, a rigid substrate is realized by a paper phenol substrate, a paper epoxy substrate, a glass composite substrate, a glass epoxy substrate, a Teflon® substrate, an alumina ceramic substrate, a low temperature co-fired ceramic/LTCC substrate, a composite substrate, or a halogen-free substrate, for example.

A paper phenol substrate is made of a material obtained by impregnating phenol resin with paper and has another name: bakelite board/bake board. A paper phenol substrate is inexpensive and exhibits excellent workability, thus being favorable to be mass-produced as a substrate for household equipment by punching with a press, for example.

A paper epoxy substrate is made of a material obtained by impregnating epoxy resin with paper and has intermediate characteristics between paper phenol and glass epoxy. A paper epoxy substrate is favorable for being used as a single-sided substrate, for example.

A glass composite substrate is made of a material obtained by impregnating epoxy resin with stacked glass fibers which are evenly cut. A glass composite substrate is favorable for being used as an inexpensive double-sided substrate, for example.

A glass epoxy substrate is made of a material obtained by impregnating epoxy resin with laminate of glass fiber cloths. A glass epoxy substrate has excellent electrical and mechanical characteristics. A glass epoxy substrate is favorable for being used as a multilayer substrate whose number of layers is larger than a double-sided substrate, for example.

A Teflon® substrate employs Teflon® as an insulating material. A Teflon® substrate has excellent high-frequency characteristics, being favorable for being used for a circuit of a UHF band and an SHF band, for example.

An alumina ceramic substrate has another name which is a green sheet and is a kind of fine ceramics which is manufactured by forming/stacking patterns on alumina/aluminum oxide with tungsten or the like and firing the laminate. An alumina ceramic substrate exhibits excellent high-frequency characteristics and thermal conductivity and is favorable for being used for a power circuit of a UHF band and an SHF band, for example.

A low temperature co-fired ceramic/LTCC substrate is a substrate produced by firing mixture of glass and ceramic at a low temperature of 800° C. A low temperature co-fired ceramic/LTCC substrate has characteristics in which a thermal expansion coefficient is small and insulation characteristics are excellent. A low temperature co-fired ceramic/LTCC substrate is favorable for being used as a substrate of a high-frequency circuit and a substrate of a high-frequency module when passive components such as a coil and a capacitor are formed in the inside of the substrate.

A composite substrate is formed by providing paper epoxy substrates on both surfaces of a glass epoxy substrate. A composite substrate is more easily processed than just a glass epoxy substrate. Further, there has recently been a composite substrate provided with Teflon® on both surfaces thereof, being favorably employed for a high-frequency circuit. Furthermore, a composite substrate has more excellent frequency characteristics than a glass epoxy substrate.

A halogen-free substrate is a multilayer substrate which has the same basic structure as that of a glass epoxy substrate but does not contain halogen-based flame retardants such as fluorine, chlorine, bromine, and iodine. A halogen-free substrate generates less toxic substance when being burnt to be recycled.

In classification based on structure, a rigid substrate is realized by a single-sided substrate, a double-sided substrate, or a multilayer substrate, for example.

In a single-sided substrate, a conductor pattern is formed only on one surface of the substrate. In a double-sided substrate, a conductor pattern is formed on both surfaces of the substrate.

A multilayer substrate is obtained by stacking insulators and patterns in a wafer fashion. On a multilayer substrate, component mounting density can be set higher than that of a single-sided substrate and a double-sided substrate. A multilayer substrate is classified into a through multilayer substrate, an IVH multilayer substrate, and a build-up substrate, for example, depending on a manufacturing method. A through multilayer substrate connects circuit conductor patterns among layers by a through hole thereof. An IVH substrate connects a plurality of disorder conductor patterns by an interstitial via hole. Layers are mutually connected by an interstitial via hole (IVH). A build-up substrate is a multilayer wiring board having high wiring density. The build-up substrate is obtained by stacking layers one by one by a sequentially-stacking method and forming a fine interlayer connection via, whose diameter is approximately 100 µm, by laser processing or the like. For a build-up substrate, stacking is basically performed layer by layer and via formation and circuit formation are performed in each stacking. That is, a build-up substrate is formed in a manner such that stacking, drilling processing, and wiring formation are repeated for respective layers to produce a printed substrate having a multilayer structure and thus to form a plurality of dielectric layers.

A flexible substrate is a wiring board which has a wiring pattern of thin copper foil on a base material made from a thin polyimide or polyester film and whose surface is covered by an insulating film or the like for protection. A flexible substrate is enough thin and flexible to be able to be freely bent and thus an outer shape and a hollow thereof can be relatively easily and freely processed. A flexible substrate is favorably employed when the substrate is small and has a complicated outer shape but is required to mount many components thereon.

Here, a rigid flexible hybrid substrate having both merits of a hard substrate and a soft substrate can be also employed.

In the illustrations of FIG. 1B and FIG. 3, the position of the second main surface 222 of the base 22 is different from the positions of the second main surface 212 of the base 21 and the second main surface 232 of the base 23, in the thickness direction. However, the position of the second main surface 222 of the base 22 may be the same as the positions of the second main surface 212 of the base 21 and the second main surface 232 of the base 23, in the thickness direction. In other words, the base 22 may be formed so as to include a dielectric layer which is integrally formed with the dielectric layer forming the second main surface 212 of the base 21 and the dielectric layer forming the second main surface 232 of the base 23.

On the first main surface 211 of the base 21, the electronic component 61, the electronic component 64, and the electronic components 65 are mounted. The electronic component 61 realizes the above-mentioned functional circuit 610. The electronic component 64 realizes the above-mentioned display circuit 640. The electronic component 61 is mounted on the portion elongated in the second direction in the base 21 and the electronic component 64 is mounted on the portion elongated in the first direction in the base 21. Here, an arrangement pattern of the electronic component 61, the electronic component 64, and the electronic components 65 can be also set based on the level of easiness in being influenced by electromagnetic interference. For example, the electronic component 65 resistant to electromagnetic interference (the electronic component 65 positioned closer to the base 22 in FIG. 1A and FIG. 1B) can be disposed near a joint end jointed with the base 22 on the base 21. On the other hand, an electronic component susceptive to electromagnetic interference (the electronic component 65 positioned closer to a lateral wall 111 of the case 11 in FIGS. 1A and 1B) may be disposed away from the joint end jointed with the base 22 on the base 21.

On the second main surface 212 of the base 21, a ground conductor pattern 51 is formed. The ground conductor pattern 51 has a planar shape substantially covering the entire surface of the second main surface 212 of the base 21. Here, it is enough that the ground conductor pattern 51 overlaps with at least the electronic component 61, the electronic component 64, and the electronic components 65 in a plan view. The ground conductor pattern 51 corresponds to a "first plane ground conductor pattern" of the present disclosure.

In the inside of the base 21, a plurality of circuit conductor patterns 71 are formed. The circuit conductor patterns 71 are composed of linear conductor patterns which are orthogonal to the thickness direction and inter-layer connection conductors which are in the thickness direction. The circuit conductor patterns 71 realize a predetermined wiring pattern in the base 21.

On the first main surface 231 of the base 23, the secondary battery 62 and the electronic component 63 are mounted. The electronic component 63 realizes the above-mentioned power receiving circuit 630. The secondary battery 62 is mounted on the portion elongated in the second direction on the base 23 and the electronic component 63 is mounted on the portion elongated in the first direction on the base 23.

On the second main surface 232 of the base 23, a ground conductor pattern 52 is formed. The ground conductor pattern 52 has a planar shape substantially covering the entire surface of the second main surface 232 of the base 23. Here, it is enough that the ground conductor pattern 52 overlaps with at least the secondary battery 62 and the electronic component 63 in a plan view. The ground conductor pattern 52 corresponds to a "second plane ground conductor pattern" of the present disclosure.

In the inside of the base 23, a plurality of circuit conductor patterns 72 are formed. The circuit conductor patterns 72 are composed of linear conductor patterns which are orthogonal to the thickness direction and inter-layer connection conductors which are in the thickness direction. The circuit conductor patterns 72 realize a predetermined wiring pattern in the base 23.

As illustrated in FIG. 1A and FIG. 1B, the power receiving coil 31 is composed of a spiral conductor pattern. The power receiving coil 31 is formed in the inside of the base 22. The power receiving coil 31 is disposed so that a surface on which the spiral conductor pattern is formed is orthogonal to the thickness direction of the base 22. In this manner, the center of an opening of the spiral shape is substantially accorded with the center of the base 22 in a plan view.

The power receiving coil 31 is connected to the circuit conductor pattern 71 of the base 21 or the circuit conductor pattern 72 of the base 23. In this fashion, the conductor pattern constituting the power receiving coil 31 is formed to be integrated with the circuit conductor pattern 71 or/and the circuit conductor pattern 72 provided on the same layer. This is easily realized by using the so-called build-up method when the base 21, the base 22, and the base 23 are formed from the above-mentioned plurality of dielectric layers.

The magnetic sheet 41 is disposed on the first main surface 221 side of the base 22. More preferably, the magnetic sheet 41 is abutted to the first main surface 221 of the base 22 as illustrated in FIG. 1B.

The magnetic sheet 41 substantially covers the entire surface of the first main surface 221 of the base 22 in a plan view. Here, it is enough that the magnetic sheet 41 covers at least the power receiving coil 31 in a plan view.

The case 11 has a substantially rectangular parallelepiped shape in a plan view and has a flat plate shape with a predetermined thickness. The case 11 includes the lateral wall 111, a lateral wall 112, a lateral wall 113, a lateral wall 114, a top wall 115, and a bottom wall 116. The lateral wall 111 and the lateral wall 112 are parallel to the second direction and the lateral wall 113 and the lateral wall 114 are parallel to the first direction. One end in the second direction of the lateral wall 111 and one end in the first direction of the lateral wall 113 are connected with each other and the other end in the second direction of the lateral wall 111 and one end in the first direction of the lateral wall 114 are connected with each other. One end in the second direction of the lateral wall 112 and the other end in the first direction of the lateral wall 113 are connected with each other and the other end in the second direction of the lateral wall 112 and the other end in the first direction of the lateral wall 114 are connected with each other. Accordingly, a hollow space surrounded by the lateral wall 111, the lateral wall 112, the lateral wall 113, and the lateral wall 114 is formed in a plan view. The top wall 115 is disposed to block one end in the thickness direction of the hollow space and the bottom wall 116 is disposed to block the other end in the thickness direction of the hollow space. Thus, the case 11 has a sealed space surrounded by the lateral wall 111, the lateral wall 112, the lateral wall 113, the lateral wall 114, the top wall 115, and the bottom wall 116.

A connection portion between the lateral wall 111 and the lateral wall 113 in the case 11 has a cutout portion C11. The cutout portion C11 between the lateral wall 111 and the lateral wall 113 means portion at which the lateral wall 111 and the lateral wall 113 are recessed toward the center of the case 11 from a corner on which the lateral wall 111 and the lateral wall 113 intersect with each other (a corner illustrated with a dotted line in FIG. 1A) and are linearly connected with each other in a plan view. In the same manner, a connection portion between the lateral wall 112 and the lateral wall 114 in the case 11 has a cutout portion C11. The cutout portion C11 between the lateral wall 112 and the lateral wall 114 means portion at which the lateral wall 112 and the lateral wall 114 are recessed toward the center of the case 11 from a corner on which the lateral wall 112 and the lateral wall 114 intersect with each other (a corner illustrated with a dotted line in FIG. 1A) and are linearly connected with each other in a plan view. On the other hand, there is no cutout portion on a connection portion between the lateral wall 111 and the lateral wall 114 and there is no portion to be cut out on a connection portion between the lateral wall 112 and the lateral wall 113. That is, the case 11 has an asymmetric shape about a reference line which passes the center and is parallel to the first direction in a plan view. In other words, the case 11 has mutually-different shapes between the first pair of corners which are symmetrically positioned about the center (the corners having the cutout portion C11) and the second pair of corners (the corners having no cutout portion).

In the sealed space of the case 11, the above-mentioned substrate 20 is disposed (contained). Here, the substrate 20 is disposed in the case 11 with the following positional relation.

The second main surface 212 of the base 21, the second main surface 222 of the base 22, and the second main surface 232 of the base 23 face the bottom wall 116 of the case 11 and are positioned close to the bottom wall 116. Further, the center of the case 11 is substantially accorded with the center of the opening of the power receiving coil 31 in a plan view. Here, it is enough that the center of the case 11 overlaps within the opening of the power receiving coil 31, further, the center of the case 11 overlaps in the inner side of the outer shape of the power receiving coil 31, in a plan view.

Figure 4A:
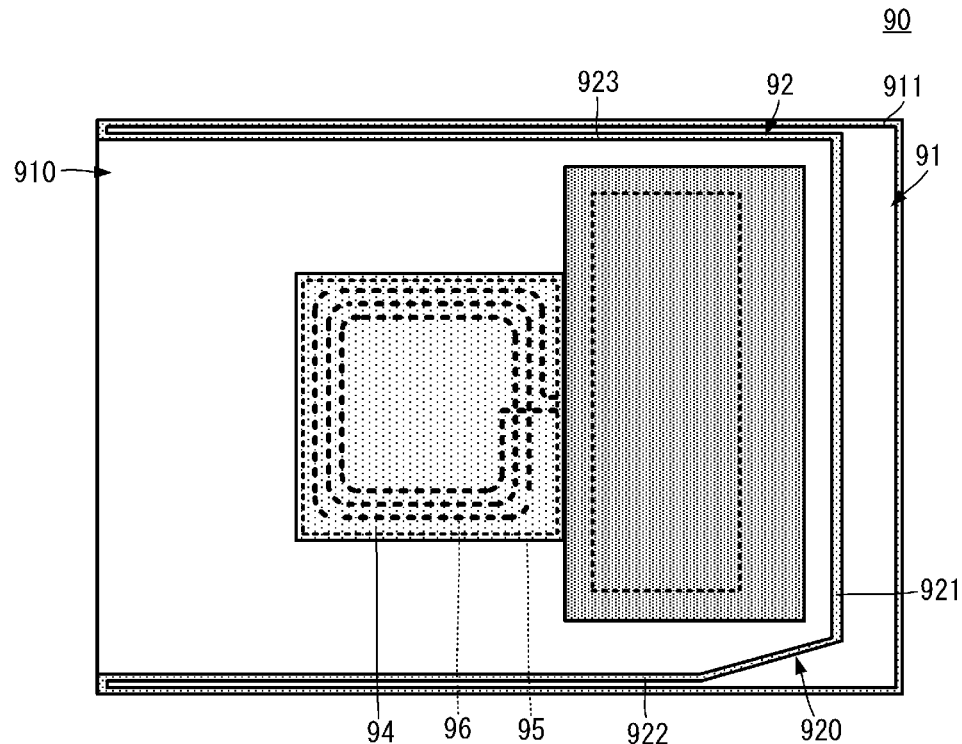
FIG. 4A is a plan sectional view illustrating a configuration of a power transmitting device.

The wireless power receiving circuit module 10 having the above-described shape is inserted into a power transmitting device having a shape described below, and thus receives power. FIG. 4A is a plan sectional view illustrating a configuration of the power transmitting device and FIG. 4B is a side sectional view illustrating the configuration of the power transmitting device.

Figure 4B:
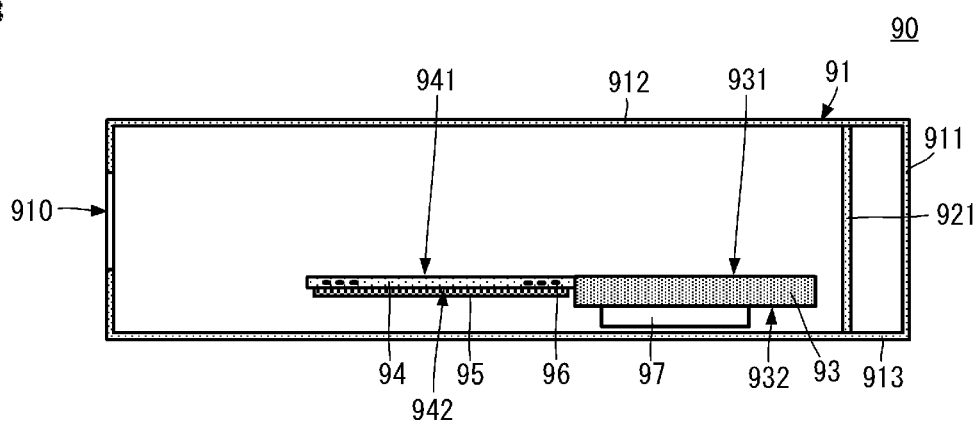
FIG. 4B is a side sectional view illustrating the configuration of the power transmitting device.

As illustrated in FIG. 4A and FIG. 4B, a power transmitting device 90 includes a case 91, a substrate 93, a substrate 94, a magnetic sheet 95, the power transmitting coil 96, and a power transmitting circuit component 97.

The case 91 includes lateral walls 911, a top wall 912, a bottom wall 913, and an inner wall 92. One of four lateral walls 911 has an opening 910. The opening 910 communicates with a space surrounded by the inner wall 92. The inner wall 92 has a wall 921 which is parallel to a surface of the opening 910 and a wall 922 and a wall 923 which are orthogonal to the surface of the opening 910. One end of the wall 921 is connected to one end of the wall 922 with an oblique wall 920 interposed therebetween. The oblique wall 920 is a wall which is disposed to form an inner angle which is not a right angle but an obtuse angle with respect to the wall 921 and the wall 922. A shape obtained by connecting the wall 921, the oblique wall 920, and the wall 922 is substantially accorded with the shape of the cutout portion C11 of the wireless power receiving circuit module 10. The other end of the wall 921 is connected to one end of the wall 923 at a substantially right angle. The other ends of the wall 922 and the wall 923 reach the opening 910. In a space surrounded by these inner wall 92, opening 910, top wall 912, and bottom wall 913, a power transmitting module having the following configuration is disposed.

The power transmitting module is composed of the substrate 93, the substrate 94, the magnetic sheet 95, the power transmitting coil 96, and the power transmitting circuit component 97.

The substrate 93 includes a first main surface 931 and a second main surface 932 and a predetermined conductor pattern is formed in the inside of the substrate 93. The substrate 94 includes a first main surface 941 and a second main surface 942. The substrate 93 is disposed so that the second main surface 932 faces the bottom wall 913 of the case 91 and is positioned close to the bottom wall 913. In a similar fashion, the substrate 94 is disposed so that the second main surface 942 faces the bottom wall 913 of the case 91 and is positioned close to the bottom wall 913. The substrate 93 and the substrate 94 are connected with each other. Here, the substrate 93 and the substrate 94 may be integrally formed.

As illustrated in FIG. 4A, the power transmitting coil 96 is composed of a spiral conductor pattern. The power transmitting coil 96 is disposed so that a surface on which the spiral conductor pattern is formed is orthogonal to the thickness direction of the substrate 94. In this manner, the center of an opening of the spiral shape is substantially accorded with the center of the substrate 94 in a plan view. As illustrated in FIG. 4B, the power transmitting coil 96 is formed in the inside of the substrate 94.

The magnetic sheet 95 is disposed on the second main surface 942 side of the substrate 94. More preferably, the magnetic sheet 95 is abutted to the second main surface 942 of the substrate 94. The magnetic sheet 95 substantially covers the entire surface of the second main surface 942 of the substrate 94 in a plan view. Here, it is enough that the magnetic sheet 95 overlaps with at least the power transmitting coil 96 in a plan view.

The power transmitting circuit component 97 is mounted on the second main surface 932 of the substrate 93.

In this configuration, the power transmitting coil 96 is disposed on a position which is almost the center of a direction connecting the wall 922 and the wall 923 and is separated from the wall 921 toward the opening 910 by a predetermined distance. This predetermined distance is equal to an approximate half of the length of the above-mentioned wireless power receiving circuit module 10 in the first direction.

Figure 5:
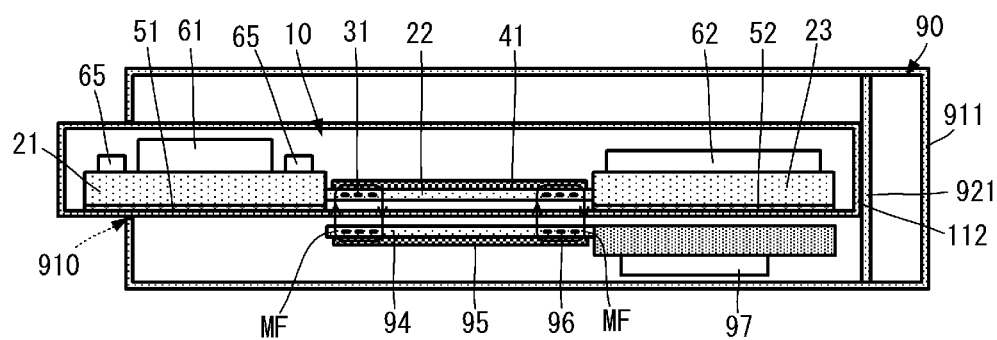
FIG. 5 is a side sectional view illustrating a state in which a wireless power receiving circuit module is inserted into a power transmitting device.

The wireless power receiving circuit module 10 is inserted into the power transmitting device 90 having the above-described configuration as illustrated in FIG. 5, and thus receives power. FIG. 5 is a side sectional view illustrating a state in which a wireless power receiving circuit module is inserted into a power transmitting device.

The wireless power receiving circuit module 10 is inserted from the opening 910 of the power transmitting device 90 along the first direction as the insertion direction. The wireless power receiving circuit module 10 is inserted into the power transmitting device 90 so that the lateral wall 112 is abutted to the wall 921 of the case 91.

In this state, the power receiving coil 31 of the wireless power receiving circuit module 10 and the power transmitting coil 96 of the power transmitting module overlap with and come close to each other, as illustrated in FIG. 5. Further, the opening of the power receiving coil 31 and the opening of the power transmitting coil 96 overlap with each other. Accordingly, the power receiving coil 31 and the power transmitting coil 96 perform magnetic field coupling with each other and the wireless power receiving circuit module 10 can receive power. A loop MF in FIG. 5 denotes a magnetic flux interlinked with the power receiving coil conductor 31 and the power transmitting coil conductor 96.

Further, the magnetic sheet 41 and the magnetic sheet 95 are positioned so as to sandwich the power receiving coil 31 and the power transmitting coil 96. Accordingly, the magnetic field in which the power receiving coil 31 and the power transmitting coil 96 are coupled with each other can be closed by the magnetic sheet 41 and the magnetic sheet 95 and thus, the magnetic field coupling between the power receiving coil 31 and the power transmitting coil 96 can be strengthened and magnetic flux density can be increased. Further, the magnetic sheet 41 increases magnetic flux density in magnetic coupling which is produced by interlinking a magnetic flux with the power receiving coil 31, with respect to a magnetic field from the outside to the wireless power receiving circuit module 10 (magnetic field obtained by magnetic field coupling with the power transmitting device 90). Thus, the wireless power receiving circuit module 10 can more efficiently receive power.

Further, the ground conductor pattern 51 overlaps with the electronic component 61, and the ground conductor pattern 51 is disposed close to a magnetic field generation portion, while the electronic component 61 is disposed away from the magnetic field generation portion. The ground conductor pattern 51 and the electronic component 61 do not overlap with the power receiving coil 31 or the power transmitting coil 96 in a plan view. Thus, the ground conductor pattern 51 shields a magnetic field, which is radiated to the outside, in the magnetic field generated by the power receiving coil 31 and the power transmitting coil 96. Accordingly, it is possible to suppress electromagnetic interference which causes an adverse effect (malfunction of the electronic component 61, for example) exerted on the electronic component 61 by a radiation magnetic field. Especially, magnetic coupling is strengthened at the power receiving coil 31 so as to enhance wireless power receiving efficiency, so that magnetic flux density is increased around the power receiving coil 31. Consequently, electromagnetic interference which causes an adverse effect (malfunction of an electronic component, for example) exerted by a radiation magnetic field can be more efficiently suppressed at an electronic component which is physically positioned away from the power receiving coil 31.

Further, the ground conductor pattern 51 is capable of preventing an electric field from the outside on the ground conductor pattern 51 side from transmitting through the base 21. That is, the ground conductor pattern 51 acts as an electric field shield which protects the circuit conductor patterns 71 in the base 21, the electronic component 61, the electronic component 64, and the electronic components 65 against the electric field from the outside on the ground conductor pattern 51 side.

Further, the ground conductor pattern 52 overlaps with the secondary battery 62, and the ground conductor pattern 52 is disposed close to a magnetic field generation portion, while the secondary battery 62 is disposed away from the magnetic field generation portion. The ground conductor pattern 52 and the secondary battery 62 do not overlap with the power receiving coil 31 or the power transmitting coil 96 in a plan view. Thus, the ground conductor pattern 52 shields a magnetic field, which is radiated to the outside, in the magnetic field generated by the power receiving coil 31 and the power transmitting coil 96. Accordingly, it is possible to suppress electromagnetic interference which causes an adverse effect (heat generation of the secondary battery 62, for example) exerted on the secondary battery 62 by a radiation magnetic field.

Further, the ground conductor pattern 52 is capable of preventing an electric field from the outside on the ground conductor pattern 52 side from transmitting through the base 23. That is, the ground conductor pattern 52 acts as an electric field shield which protects the circuit conductor patterns 72 in the base 23, the secondary battery 62, and the electronic component 63 against the electric field from the outside on the ground conductor pattern 52 side.

Thus, with the configuration of the present embodiment, power-receiving efficiency can be improved and electromagnetic interference which adversely affects other electronic components such as an IC chip and a secondary battery can be suppressed in the wireless power receiving circuit module.

Further, in the configuration of the present embodiment, the base 22 is thin and the distance between the magnetic sheet 41 and the power receiving coil 31 is short. The distance between the power transmitting coil 96 and the magnetic sheet 95 is short. Accordingly, a magnetic field more easily concentrates in the power receiving coil 31 and the power transmitting coil 96.

Further, in the configuration of the present embodiment, the cutout portions C11 which are laterally asymmetric are formed on the wireless power receiving circuit module 10 and the power transmitting device 90 has the oblique wall 920 matching the cutout portion C11. Accordingly, the wireless power receiving circuit module 10 can receive power only in a state in which the top surface of the wireless power receiving circuit module 10 and the top surface of the power transmitting device 90 face each other and the bottom surface of the wireless power receiving circuit module 10 and the bottom surface of the power transmitting device 90 face each other. Thus, the wireless power receiving circuit module 10 can be prevented from being erroneously inserted upside down, improving safety and reliability.

Further, in the configuration of the present embodiment, the cutout portions C11 of the wireless power receiving circuit module 10 are diagonally positioned in a plan view. In addition to this, the center of the case 11 is positioned within the outer shape of the power receiving coil 31 and more preferably positioned within the opening, and furthermore preferably, the center of the case 11 is accorded with almost the center of the opening of the power receiving coil 31. Accordingly, power can be received both when the wireless power receiving circuit module 10 is inserted into the power transmitting device 90 from the lateral wall 111 side and when the wireless power receiving circuit module 10 is inserted into the power transmitting device 90 from the lateral wall 112 side. This can eliminate complexity of an insertion direction in insertion of the wireless power receiving circuit module 10.

Here, the base 21 and the base 23 are set to be rigid substrates and the base 22 is set to be a flexible substrate in the above description, but the base 23 may be set to be a flexible substrate as well. In addition, the thickness (the number of layers) of the base 21 and the thickness (the number of layers) of the base 23 are set to be the same as each other in the above description, but these may be set to differ from each other.

The above description has introduced the case where the number of layers of the base 21 and the number of layers of the base 23 are larger than the number of layers of the base 22. However, the configuration may be employed in which the number of layers of the base 21 and the number of layers of the base 23 are smaller than the number of layers of the base 22.

What is claimed is:

1. A wireless power receiving circuit module comprising:
   a first base in which a plurality of dielectric layers are stacked and a circuit conductor pattern is configured;
   a second base whose number of layers is different from that of the first base, and that fails to overlap with the first base in a plan view and shares a predetermined dielectric layer with the first base;
   an electronic component that is mounted on a first main surface of the first base;
   a wireless power receiving coil that is composed of a conductor pattern configured in the second base and is electrically connected with the circuit conductor pattern; and
   a first plane ground conductor pattern that is disposed on a side of a second main surface in the first base, the second main surface being opposed to the first main surface, and overlaps with at least the electronic component in the plan view, wherein
   the first plane ground conductor pattern is configured as an electric field shield that protects the circuit conductor pattern configured in the first base against an electric field from an outside, and
   the wireless power receiving coil is configured to produce magnetic coupling by interlinking a magnetic flux with a magnetic field from the outside,
   whereby the electric field shield for the circuit conductor pattern and the magnetic coupling are established at the same time.

2. The wireless power receiving circuit module according to claim 1, wherein the first plane ground conductor pattern is configured as an electric field shield that protects the circuit conductor pattern configured in the first base against an electric field from an outside, the electric field coming from afar of the second main surface to the second main surface of the first base.

3. The wireless power receiving circuit module according to claim 2, comprising:
a magnetic sheet, wherein
the wireless power receiving coil is disposed on a side of the first main surface in the second base,
the magnetic sheet
overlaps with the conductor pattern of the wireless power receiving coil in the plan view, and
increases magnetic flux density in magnetic coupling that is produced by interlinking a magnetic flux with the wireless power receiving coil, with respect to a magnetic field from the outside,
thereby establishing an electric field shield for the circuit conductor pattern and enhancement of the magnetic coupling at the same time.

4. The wireless power receiving circuit module according to claim 2, wherein
the second base is configured by protruding and stacking parts of the dielectric layers stacked in the first base, as the second base.

5. The wireless power receiving circuit module according to claim 2, wherein
the first base and the second base are made of the same material.

6. The wireless power receiving circuit module according to claim 2, further comprising:
a third base that includes a dielectric layer on which a circuit conductor pattern is configured, the circuit conductor pattern being electrically connected with a secondary battery;
the secondary battery that is mounted on a first main surface of the third base; and
a second plane ground conductor pattern that is disposed on a side of a second main surface of the third base and overlaps with the secondary battery in the plan view.

7. The wireless power receiving circuit module according to claim 1, comprising:
a magnetic sheet, wherein
the wireless power receiving coil is disposed on a side of the first main surface in the second base,
the magnetic sheet
overlaps with the conductor pattern of the wireless power receiving coil in the plan view, and
increases magnetic flux density in magnetic coupling that is produced by interlinking a magnetic flux with the wireless power receiving coil, with respect to a magnetic field from the outside,
thereby establishing an electric field shield for the circuit conductor pattern and enhancement of the magnetic coupling at the same time.

8. The wireless power receiving circuit module according to claim 7, wherein
the magnetic sheet is configured to increase magnetic flux density in magnetic coupling that is produced by interlinking a magnetic flux with the wireless power receiving coil, with respect to a magnetic field from the outside, the magnetic field coming from afar of the second main surface to the second main surface of the second base.

9. The wireless power receiving circuit module according to claim 7, wherein
the second base is configured by protruding and stacking parts of the dielectric layers stacked in the first base, as the second base.

10. The wireless power receiving circuit module according to claim 1, wherein
the second base is configured by protruding and stacking parts of the dielectric layers stacked in the first base, as the second base.

11. The wireless power receiving circuit module according to claim 1, wherein
the first base and the second base are made of the same material.

12. The wireless power receiving circuit module according to claim 1, further comprising:
a third base that includes a dielectric layer on which a circuit conductor pattern is configured, the circuit conductor pattern being electrically connected with a secondary battery;
the secondary battery that is mounted on a first main surface of the third base; and
a second plane ground conductor pattern that is disposed on a side of a second main surface of the third base and overlaps with the secondary battery in the plan view.

13. The wireless power receiving circuit module according to claim 12, wherein
the first plane ground conductor pattern and the second plane ground conductor pattern are integrally configured as a common plane ground conductor pattern.

14. The wireless power receiving circuit module according to claim 13, wherein
the first base is a rigid substrate made of an insulating base material having no flexibility, and
the second base or the third base is a flexible substrate that has enough flexibility to be bendable.

15. The wireless power receiving circuit module according to claim 13, wherein
the first base, the second base, or the third base is composed of a plurality of dielectric layers that are stacked in a state in which a planar conductor pattern and an inter-layer connection conductor pattern are configured on each of the plurality of dielectric layers, and
the circuit conductor pattern and the conductor pattern of the wireless power receiving coil are configured by electrically connecting the conductor patterns configured on the plurality of dielectric layers.

16. The wireless power receiving circuit module according to claim 13, comprising:
a case that has a flat plate shape and contains the first base, the second base, the third base, the electronic component, the secondary battery, the wireless power receiving coil, the first plane ground conductor pattern, and a magnetic sheet, wherein
the case has a substantially rectangular parallelepiped shape in the plan view, and
a center of the case in the plan view is positioned within an outer shape of the wireless power receiving coil.

17. The wireless power receiving circuit module according to claim 12, wherein
the first base is a rigid substrate made of an insulating base material having no flexibility, and
the second base or the third base is a flexible substrate that has enough flexibility to be bendable.

18. The wireless power receiving circuit module according to claim 12, wherein
the first base, the second base, or the third base is composed of a plurality of dielectric layers that are stacked in a state in which a planar conductor pattern and an inter-layer connection conductor pattern are configured on each of the plurality of dielectric layers, and the circuit conductor pattern and the conductor pattern of the wireless power receiving coil are configured by electrically connecting the conductor patterns configured on the plurality of dielectric layers.

19. The wireless power receiving circuit module according to claim 12, comprising:

a case that has a flat plate shape and contains the first base, the second base, the third base, the electronic component, the secondary battery, the wireless power receiving coil, the first plane ground conductor pattern, and a magnetic sheet, wherein the case has a substantially rectangular parallelepiped shape in the plan view, and a center of the case in the plan view is positioned within an outer shape of the wireless power receiving coil.

20. The wireless power receiving circuit module according to claim 19, wherein the case has mutually-different shapes between a first pair of corners whose positions are symmetric about the center and a second pair of corners whose positions are symmetric about the center.

\* \* \* \* \*